United States Patent
Fahrenbruch et al.

(10) Patent No.: US 8,169,252 B2
(45) Date of Patent: May 1, 2012

(54) LOW VOLTAGE DROP CLOSED LOOP UNIDIRECTIONAL ELECTRONIC VALVE

(75) Inventors: Shawn Anthony Fahrenbruch, Tustin, CA (US); George Liu, Irvine, CA (US)

(73) Assignee: Microsemi Corporation, Alisa Viejo, CA (US)

( * ) Notice: Subject to any disclaimer, the term of this patent is extended or adjusted under 35 U.S.C. 154(b) by 175 days.

(21) Appl. No.: 12/815,496

(22) Filed: Jun. 15, 2010

(65) Prior Publication Data
US 2011/0006232 A1  Jan. 13, 2011

Related U.S. Application Data

(60) Provisional application No. 61/224,238, filed on Jul. 9, 2009.

(51) Int. Cl.
*H03K 17/687* (2006.01)
*H01L 31/042* (2006.01)

(52) U.S. Cl. ........ 327/434; 327/427; 136/244; 307/130; 361/88

(58) Field of Classification Search .................. 327/427, 327/434; 136/243, 244, 252; 307/117, 127, 307/130; 361/88
See application file for complete search history.

(56) References Cited

U.S. PATENT DOCUMENTS

| | | | |
|---|---|---|---|
| 4,728,825 A | 3/1988 | Sugayama et al. | |
| 6,271,712 B1 | 8/2001 | Ball | |
| 6,864,414 B2 | 3/2005 | Sharps et al. | |
| 7,199,636 B2 | 4/2007 | Oswald et al. | |
| 7,864,497 B2 * | 1/2011 | Quardt et al. | 361/92 |
| 2004/0135545 A1 | 7/2004 | Fowler et al. | |
| 2007/0186969 A1 | 8/2007 | Kohler et al. | |
| 2008/0198523 A1 | 8/2008 | Schmidt et al. | |
| 2009/0014050 A1 | 1/2009 | Haaf | |
| 2009/0195081 A1 | 8/2009 | Quardt et al. | |

FOREIGN PATENT DOCUMENTS

| | | |
|---|---|---|
| FR | 1422496 | 12/1965 |
| JP | 2000-174308 | 6/2000 |

OTHER PUBLICATIONS

Shimizu, T; Hirakata, M.; Kamezawa, T.; and Watanabe, H; Generation Control Circuit for Photovoltaic Modules; IEEE Transactions on Power Electronics, vol. 16, No. 3, May 2001, pp. 293-300, Institute for Electrical and Electronics Engineers, Piscataway, N.J.
Office Action dated May 18, 2011 from USPTO for U.S. Appl. No. 12/348,002.
International Search Report for parallel application PCT/US2010/038583, mailed Aug. 26, 2010 by European Patent Office.

(Continued)

*Primary Examiner* — Patrick O'Neill
(74) *Attorney, Agent, or Firm* — Simon Kahn

(57) ABSTRACT

A low voltage drop unidirectional electronic valve constituted of: a first terminal; a second terminal; a first electronically controlled switch coupled between the first terminal and the second terminal; and a first charge pump arranged to close the first electronically controlled switch when the voltage potential at the first terminal is greater than the voltage potential at the second terminal by a first value. The first charge pump is arranged in a closed loop with the first electronically controlled switch so as to continuously maintain the voltage potential at the first terminal greater than the voltage potential at the second terminal by the first value.

17 Claims, 4 Drawing Sheets

OTHER PUBLICATIONS

Written Opinion of the International Searching Authority for parallel application PCT/US2010/038583, mailed Aug. 26, 2010 by European Patent Office.

Tanzawa, Toru and Tomoharu, Tanaka; "A Dynamic Analysis of the Dickson Charge Pump Circuit"; IEEE Journal of Solid-State Circuits, Aug. 1997, pp. 1231-1240, vol. 32, No. 8; IEEE New York.

Makowski, Marek S.; "Realizability Conditions and Bounds on Synthesis of Switched-Capacitor DC-DC Voltage Multiplier Circuits"; IEEE Transactions on Circuits and Systems—I: Fundamental Theory and Applications, Aug. 1997, pp. 684-691, vol. 44 No. 8; IEEE New York.

Witters, Johan S, et al; "Analysis and Modeling of On-Chip High-Voltage Generator Circuits for Use in EEPROM Circuits"; IEEE Journal of Solid-State Circuits, Oct. 1989, pp. 1372-1380, vol. 24, No. 5; IEEE New York.

* cited by examiner

*Prior Art*     Fig. 1

LOW VOLTAGE DROP CLOSED LOOP UNIDIRECTIONAL ELECTRONIC VALVE

CROSS-REFERENCE TO RELATED APPLICATIONS

This application claims priority from U.S. Provisional Patent Application Ser. No. 61/224,238 filed Jul. 9, 2009 entitled "Low Voltage Drop Closed Loop Unidirectional Electronic Valve", the entire contents of which is incorporated herein by reference.

BACKGROUND

The invention relates generally to the field of unidirectional electronic valves, and more particularly to a low voltage drop unidirectional electronic valve operating as a near ideal diode.

Solar power for large scale use, and/or for feeding into a power grid, is typically supplied by an array of serially connected solar panels. Each solar panel exhibits a positive terminal, and a return, or negative terminal. Solar panels generate electricity in the presence of an appropriate amount of sunlight, and thus one solar panel in the array may be in a dark condition, while others may be generating electricity. The dark condition may be caused by, among others, a flying object or bird, a cloud covering, or accumulated dirt. Electricity must be bypassed around the dark solar panel so that the output of the array is not blocked. Similarly, in the event of a failure of a single solar panel in the array, electricity must be bypassed around the failed solar panel so as to avoid failure of the entire array.

FIG. 1 illustrates an example of a technique known to the prior art to avoid failure of a solar array due to a dark or failed solar panel. The solar power arrangement of FIG. 1 comprises a plurality of solar panels 10, a plurality of bypass diodes 20, a blocking diode 30 and a converter 40. Solar panels 10 are connected serially, with the positive terminal of the ultimate solar panel 10 connected to the input of converter 40 via blocking diode 30. The return of converter 40 is connected to the return terminal of the first solar panel 10 of the arrangement. Each solar panel 10 has connected in parallel thereto a bypass diode 20, arranged to conduct only when the return terminal of the solar panel 10 to which it is connected exhibits a positive potential in relation to the positive terminal of that solar panel 10 in accordance with IEC 61215, published by the International Electrotechnical Commission, Geneva, Switzerland, and in particular section 10.18, the entire contents of IEC 61215 is incorporated herein by reference.

In operation, a dark solar panel 10 will exhibit a voltage reversal between the positive terminal and return terminal as a result of the current being driven into the return terminal from the positive terminal of the preceding solar panel 10. This voltage reversal rises to turn on the parallel connected bypass diode 20, thereby passing current around the dark solar panel 10.

The arrangement of FIG. 1 is successful in maintaining an output despite a dark solar panel; however the power dissipation of a bypass diode 20 is substantial. In a typical solar panel array, such as the arrangement of FIG. 1A, approximately 5-10 Amperes are flowing through each of the solar panels 10 in the array. Thus the power dissipation of a bypass diode 20, when operative as a bypass, is on the order of 3.5-7 Watts. The power lost to the system is emitted as heat, which thus drives thermal considerations for panel layout, construction of bypass diode 20 and ultimately cost of the arrangement of FIG. 1.

U.S. patent application Ser. No. 12/348,002 filed Jan. 1, 2009 entitled "Low Voltage Drop Unidirectional Electronic Valve", the entire contents of which is incorporated herein by reference, is addressed to a low voltage drop unidirectional electronic valve comprising an electronically controlled switch constituted of a pair of field effect transistors, a control circuit and a refresh circuit arranged to periodically open the electronically controlled switch. The requirement for the periodic opening of the switch leads to a reverse voltage build up across the solar panel which is undesirable.

There is thus a long felt need for a low voltage drop unidirectional electronic valve adaptable for use as one of a solar panel bypass element not requiring a reverse voltage refresh.

SUMMARY OF THE INVENTION

Accordingly, it is a principal object of the present invention to overcome the disadvantages of prior art unidirectional electronic valves. This is provided in certain embodiments by a unidirectional electronic valve comprising an electronically controlled switch, such as a MOSFET, arranged to connect between a first terminal and a second terminal. A first charge pump is further provided and arranged to close the first electronically controlled switch when the voltage potential at the first terminal is greater than the voltage potential at the second terminal by a first value. The first charge pump is arranged in a closed loop with the first electronically controlled switch so as to continuously maintain the voltage potential at the first terminal greater than the voltage potential at the second terminal by the first value. Advantageously, a reverse voltage potential of about 50 millivolts is continuously provided when the solar panel is in a shaded condition.

In one embodiment, a low voltage drop unidirectional electronic valve is provided, comprising: a first terminal; a second terminal; a first electronically controlled switch coupled between the first terminal and the second terminal; and a first charge pump arranged to close the first electronically controlled switch when the voltage potential at the first terminal is greater than the voltage potential at the second terminal by a first value.

In one further embodiment, the first charge pump is arranged in a closed loop with the first electronically controlled switch so as to continuously maintain the voltage potential at the first terminal greater than the voltage potential at the second terminal by the first value. In one yet further embodiment, the low voltage unidirectional electronic valve further comprises: a bypass element coupled in parallel with the first electronically controlled switch, the bypass element arranged to allow the flow of current from the first terminal to the second terminal when the voltage potential at the first terminal is greater than the voltage potential at the second terminal by a second value, the second value greater than the first value; and a start up unit coupled to the first terminal and arranged to provide initial power to the first charge pump responsive to the voltage potential at the first terminal being greater than the voltage potential at the second terminal by the second value. In one yet even further embodiment the first electronically controlled switch is constituted of a metal oxide semiconductor field effect transistor exhibiting a body diode, the body diode being the bypass element. In another yet even further embodiment the start up unit comprises: an oscillator operative responsive to the voltage potential at the first terminal being greater than the voltage potential at the second terminal by the second value; a second charge pump responsive to the oscillator; and a second electronically controlled switch responsive to the second charge pump, the second electronically controlled switch arranged to couple the second terminal to an internal common node when the second charge pump is active.

In one yet even further embodiment the start up unit further comprises: a third charge pump operative responsive to the oscillator, the third charge pump arranged to provide the initial power to the first charge pump. In another yet even further embodiment the start up unit further comprises: a unidirectional valve circuit coupled between the oscillator and the second terminal, the unidirectional valve circuit arranged to provide an initial return path for the oscillator. In another yet even further embodiment the low voltage unidirectional electronic valve further comprises a bootstrap circuit coupled between the output of the first charge pump and the power input of the first charge pump. In another yet even further embodiment the low voltage unidirectional electronic valve further comprises a third electronically controlled switch connected between the second terminal and the internal common node, the third electronically controlled switch responsive to the bootstrap circuit.

In another further embodiment the start up unit further comprises: a third charge pump operative responsive to the oscillator, the third charge pump arranged to provide the initial power to the first charge pump.

Independently, in one embodiment a method of providing a low voltage drop unidirectional current flow is provided, the method comprising: providing an electronically controlled switch coupled between a first terminal and a second terminal; closing the provided electronically controlled switch when the voltage potential at the first terminal is greater than the voltage potential at the second terminal by a first value; and continuously maintaining the voltage potential at the first terminal greater than the voltage potential at the second terminal by a second value, the second value less than the first value.

In one further embodiment the method further comprises providing a first charge pump, the continuously maintaining being responsive to the provided first charge pump. In one yet further embodiment the method further comprises providing a bypass element coupled in parallel with the provided electronically controlled switch, the bypass element arranged to allow the flow of current from the first terminal to the second terminal when the voltage potential at the first terminal is greater than the voltage potential at the second terminal by the first value; and providing initial power to the provided first charge pump responsive to the voltage potential at the first terminal being greater than the voltage potential at the second terminal by the first value. In another yet further embodiment the method further comprises coupling the second terminal to an internal common node.

Additional features and advantages of the invention will become apparent from the following drawings and description.

BRIEF DESCRIPTION OF THE DRAWINGS

For a better understanding of the invention and to show how the same may be carried into effect, reference will now be made, purely by way of example, to the accompanying drawings in which like numerals designate corresponding elements or sections throughout.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice. In the accompanying drawings.

DETAILED DESCRIPTION OF THE PREFERRED EMBODIMENTS

Figure 1:
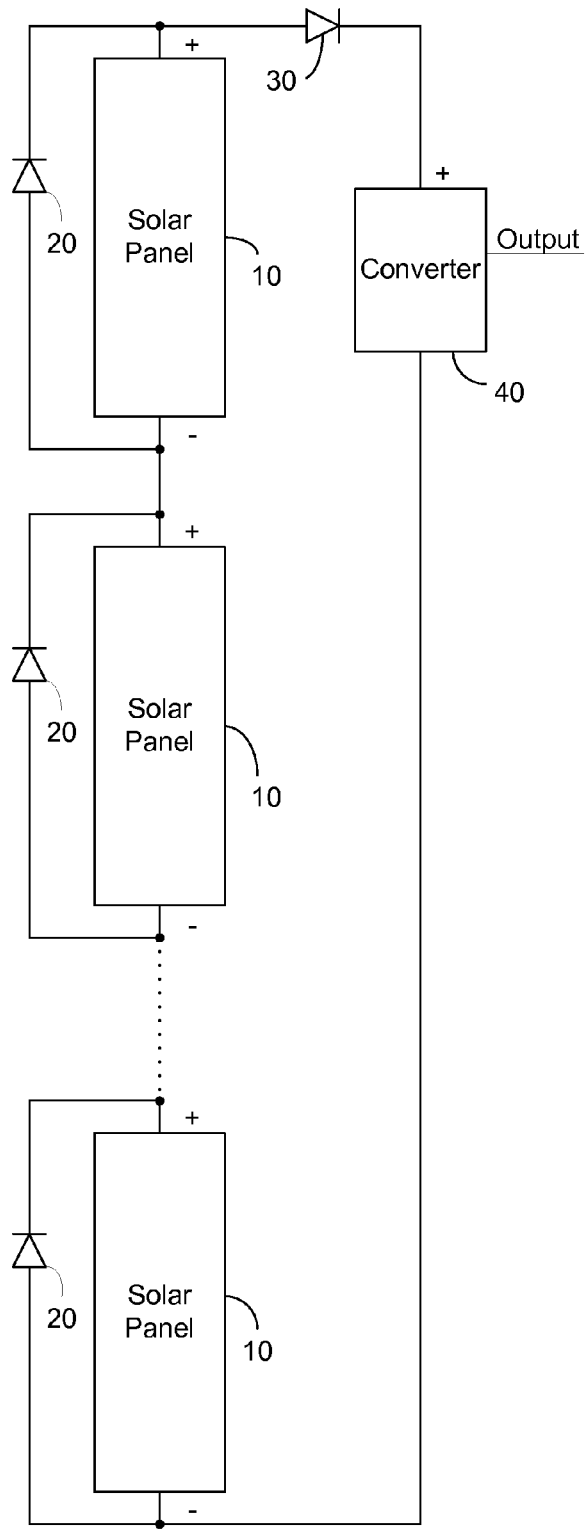
FIG. 1 illustrates a high level block diagram of a solar power arrangement comprising a serially connected solar panel array, each exhibiting a bypass diode, in accordance with the prior art.

Before explaining at least one embodiment of the invention in detail, it is to be understood that the invention is not limited in its application to the details of construction and the arrangement of the components set forth in the following description or illustrated in the drawings. The invention is applicable to other embodiments or of being practiced or carried out in various ways. Also, it is to be understood that the phraseology and terminology employed herein is for the purpose of description and should not be regarded as limiting.

Figure 2:
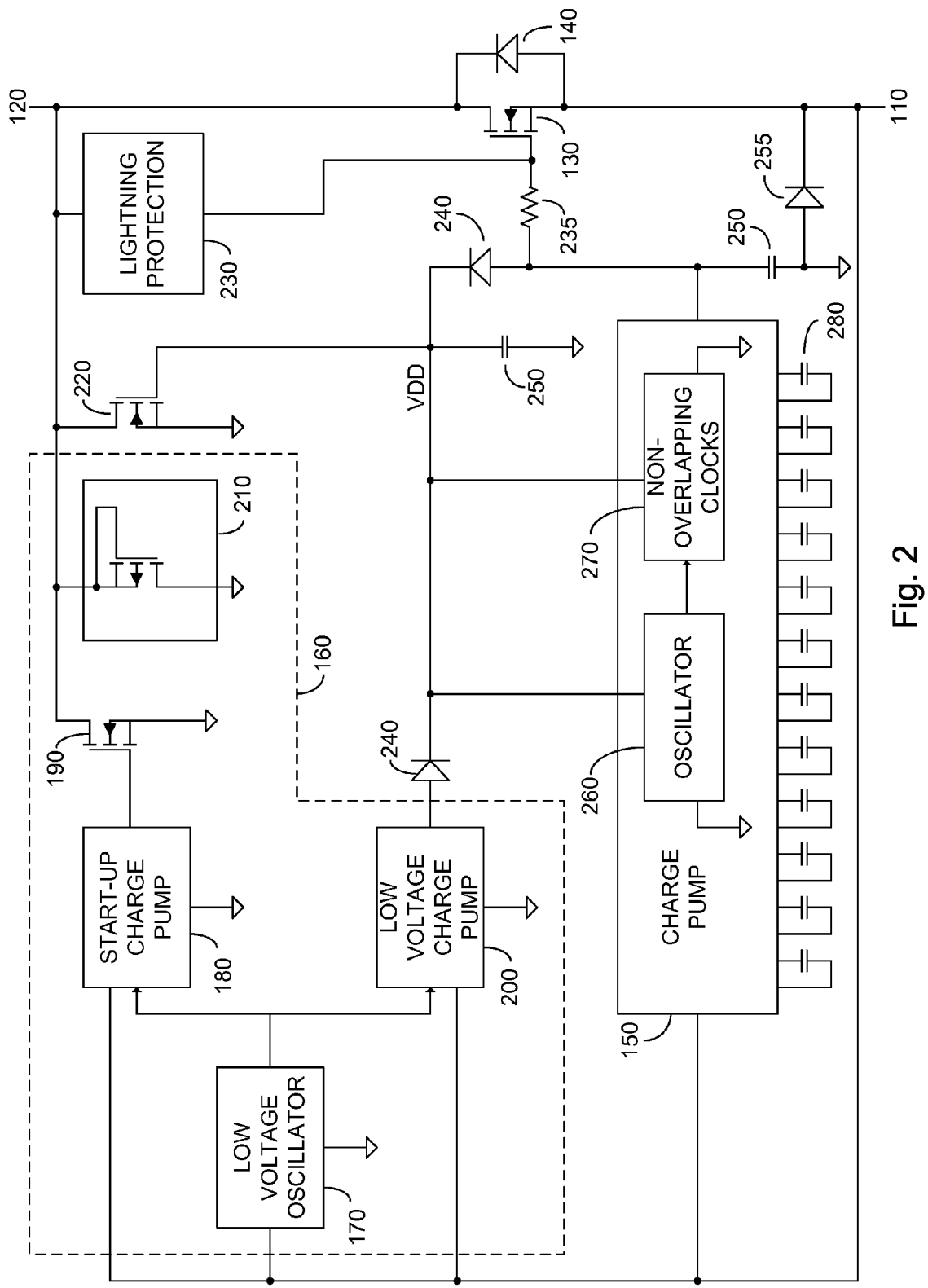
FIG. 2 illustrates a high level schematic diagram of an exemplary embodiment of a low voltage drop closed loop unidirectional electronic valve.

FIG. 2 illustrates a high level schematic diagram of an exemplary embodiment of a low voltage drop closed loop unidirectional electronic valve comprising: a first terminal 110; a second terminal 120; an electronically controlled switch 130, illustrated without limitation as an NMOSFET; a bypass element 140, illustrated without limitation as the inherent body diode of the NMOSFET of electronically controlled switch 130; a charge pump 150; a start-up unit 160; an electronically controlled switch 220; a lightning protection circuit 230; a resistor 235; a first and a second diode 240; and a first and a second filtering capacitor 250. Start up unit 160 comprises: a low voltage oscillator 170; a start-up charge pump 180; an electronically controlled switch 190; a low voltage charge pump 200; an initializing unidirectional valve circuit 210; and a diode 255. Charge pump 150 comprises an oscillator 260 and a plurality of non-overlapping clocks 270, and is illustrated without limitation as a 1:100 charge pump with 12 ceramic capacitors 280, however this is not meant to be limiting in any way.

First terminal 110 is connected to the return terminal of the solar panel, as described above in relation to FIG. 1, and second terminal 120 is connected to the positive terminal of the solar panel as described above in relation to FIG. 1. A first terminal of electronically controlled switch 130, illustrated as the source terminal of an NMOS implementation, is connected to first terminal 110. A second terminal of electronically controlled switch 130, illustrated as the drain terminal of an NMOS implementation, is connected to second terminal 120. Bypass element 140, is arranged to pass current from first terminal 110 to second terminal 120 in the event that the voltage potential of first terminal 110 is greater than the voltage potential of second terminal 120 by a diode drop, which over a range of temperature is typically greater than 0.4 volts.

First terminal 110 is further connected to the input of charge pump 150 and to the input of start up unit 160, in particular to low voltage oscillator 170, start-up charge pump 180 and low voltage charge pump 200. Each of charge pump 150, low voltage oscillator 170, start-up charge pump 180 and low voltage charge pump 200 further exhibits a connection to a common potential node, preferably internal to the low voltage drop closed loop unidirectional electronic valve. The output of low voltage oscillator 170 is connected to the input of start-up charge pump 180 and to the input of low voltage charge pump 200. The output of start-up charge pump 180 is connected to the gate of electronically controlled switch 190, illustrated without limitation as an NMOSFET. The source of electronically controlled switch 190 is connected to the common potential node, and the drain of electronically controlled switch 190 is connected to second terminal 120.

Initializing unidirectional valve circuit 210, illustrated in a non-limiting embodiment as PMOSFET, is connected between second terminal 120 and the common potential node. In the non-limiting embodiment in which initializing unidirectional valve circuit 210 is implemented as a PMOSFET, the source and gate of unidirectional valve circuit 210 are connected to second terminal 120 and the drain of unidirectional valve circuit 210 is connected to the common potential node.

The output of charge pump 150 is connected to the gate of electronically controlled switch 130 and to a first end of lightning protection circuit 230 via resistor 235, to a first end of first capacitor 250, and to the anode of first diode 240. The cathode of first diode 240, illustrated as a VDD potential, is connected to a first end of second capacitor 250, to the cathode of second diode 240, to the gate of electronically controlled switch 220, illustrated without limitation as an NMOSFET, and the power inputs of charge pump 150, illustrated as connected to each of oscillator 260 and plurality of non-overlapping clocks 270. The common potential node is further connected to each of oscillator 260 and plurality of non-overlapping clocks 270.

The drain of electronically controlled switch 220 is connected to second terminal 120 and the source of electronically controlled switch 220 is connected to the common potential node. The output of low voltage charge pump 200 is connected to the anode of second diode 240. The second end of lightning protection circuit 230 is connected to second terminal 120. The second end of each of first and second capacitors 250 are connected to the common potential node. The common potential node is connected to the anode of diode 255 and the cathode of diode 255 is connected to first terminal 110.

In operation, when second terminal 120 is at a higher voltage potential than first terminal 110, i.e. when the associated solar panel is producing electricity, initializing unidirectional valve circuit 210 does not conduct, and the common potential node is tied to first terminal 110 by diode 255. In an exemplary embodiment, an NMOSFET is further supplied in parallel with diode 255 to ensure tight connection between first terminal 110 and the common potential node.

When the associated solar panel is shaded, the potential of first terminal 110 rises above the potential of second terminal 120, as described above in relation to FIG. 1, and current begins to flow through bypass element 140. Bypass element 140 is preferably arranged to pass current of at least 10 Amperes for a short period of time until charge pump 150 turns on, as will be described further hereinto below. In an exemplary embodiment, significant current flows through bypass element 140 for less than 50 msec. Bypass element 140 exhibits a voltage drop equivalent to that of a diode, which over a broad of operating conditions is at least 0.4 volts.

The forward voltage drop across bypass element 140 is sufficient to operate low voltage oscillator 170, which is designed to operate with voltages down to about 0.3 volts. The return path of low voltage oscillator 170 is through initializing unidirectional valve circuit 210. In one embodiment, initializing unidirectional valve circuit 210 is constituted of a leaky PMOS, which acts a resistor between the common potential node and second terminal 120, which as indicated above is at a lower potential than first terminal 110. Preferably, initializing unidirectional valve circuit 210 is arranged to drop no more than 100 mV when first terminal 110 is of a greater potential than second terminal 120.

The output of low voltage oscillator 170 is fed to start up charge pump 180, which begins to generate sufficient voltage to close electronically controlled switch 190, thus directly connecting the common potential node to second terminal 120. It is to be understood that electronically controlled switch 190, when closed, presents a lower resistance path between second terminal 120 and the common potential node than that provided by initializing unidirectional valve circuit 210.

The output of low voltage oscillator 170 is further fed to low voltage charge pump 200, whose operation is preferably aided by the improved low resistance path between second terminal 120 and the common potential node provided by closed electronically controlled switch 190. The output of low voltage charge pump 200, which in an exemplary embodiment is about 2 volts, is fed via second diode 240 to charge pump 150.

Charge pump 150, comprising therein oscillator 260 and plurality of non-overlapping clocks 270, is in an exemplary embodiment a 1:100 gain charge pump, preferably implemented as a Makowski charge pump. In one non-limiting example oscillator 260 is a 50 μsec oscillator, and capacitors 280 are each ceramic capacitors of appropriate values, such as: 10 nF; 15 nF; 22 nF; 33 nF; 39 nF; 47 nF; 56 nF; 74 nF; 100 nF; 150 nF; 220 nF; and 1 μF, respectively.

As charge pump 150 operates, an output voltage is generated across first capacitor 250, which acts to filter the output. In one non-limiting example, first capacitor 250 is a 100 pF capacitor. The output of charge pump 150, which in a non-limiting example is 5 volts in relation to the common potential node, is fed to the gate of electronically controlled switch 130. As indicated above, the source of electronically controlled switch 130 is connected to first terminal 110, and the common potential node is tied to second terminal 120 by the action of electronically controlled switch 190, thus the gate of electronically controlled switch 130 is at a significantly higher potential than the source and drain of electronically controlled switch 130, thereby closing electronically controlled switch 130 and allowing current to flow there through with low voltage loss.

The output of charge pump 150 is fed via first diode 240 to the power input of charge pump 150 across second capacitor 250, which acts as a smoothing capacitor, and thus the operation of charge pump 150 is self sustaining provided that an input potential between first terminal 110 and the common potential node is maintained at a minimal value. In an exemplary embodiment a 50 mV value is maintained. In one non-limiting embodiment, second capacitor 250 is a 500 pF capacitor, selected to be sufficient to handle load spikes of charge pump 150. As indicated above the cathode of first diode 240 is at a potential denoted VDD, which is the operating voltage of charge pump 150. The output of low voltage charge pump 200 is disconnected by the action of second diode 240.

Charge pump 150 and electronically controlled switch 130 are thus arranged in a closed loop, and the required minimal potential value is automatically continuously maintained without requiring refresh. In particular, in the event that the input voltage between first terminal 110 and the common potential node begins to fall, the output of charge pump 150 will similarly fall thus increasing the resistance presented across electronically controlled switch 130. Similarly, in the event that the input voltage between first terminal 110 and the common potential node begins to rise, the output of charge pump 150 will similarly rise thus decreasing the resistance presented across electronically controlled switch 130.

The voltage between first terminal 110 and second terminal 120 during operation of charge pump 150, denoted $V_{DIODE}$, can be represented by the equation:

$$V_{DIODE} = \frac{V_{TH}\left(1 + \sqrt{1 + \frac{4 I_{DIODE} \, GAIN}{K * V_{TH}^2}}\right)}{GAIN}$$

where $V_{TH}$ represents the turn on threshold of electronically controlled switch 130, K represents the MOSFET transconductance coefficient of electronically controlled switch 130, $I_{DIODE}$ represents the current flow between first terminal 110 and second terminal 120 during operation of charge pump 150, and GAIN represents the gain of charge pump 150.

The minimal potential voltage indicated above is insufficient to maintain the operation of start-up unit 160, which thus shuts down. Electronically controlled switch 220, whose gate is connected to VDD maintains the connection between the common potential node and second terminal 120.

Lighting protection circuit 230 provides lightning protection for the low voltage drop closed loop unidirectional electronic valve, and its operation will be described further hereinto below.

Figure 3:
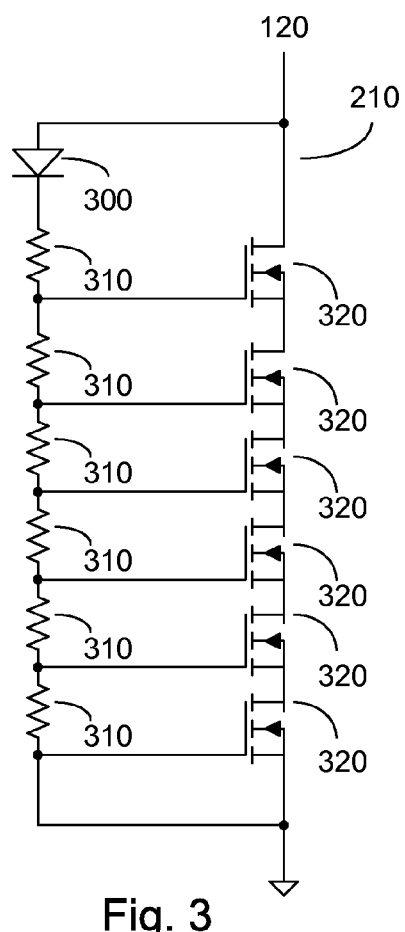
FIG. 3 illustrates a schematic diagram of a laddered implementation of the initializing unidirectional valve circuit of the low voltage drop closed loop unidirectional electronic valve of FIG. 2.

FIG. 3 illustrates a schematic diagram of a laddered implementation of the initializing unidirectional valve circuit 210 of the low voltage drop closed loop unidirectional electronic valve of FIG. 2, comprising: a diode 300; a plurality of resistors 310; and a plurality of NMOSFETs 320. Second terminal 120 and the common potential node are further shown for clarity. The anode of diode 300 is connected to second terminal 120, and a first end of a first resistor 310 is connected to the cathode of diode 300.

The second end of first resistor 310 is connected to the gate of a first NMOSFET 320 and to a first end of a second resistor 310. The second end of second resistor 310 is connected to the gate of a second NMOSFET 320 and to a first end of a third resistor 310. The second end of third resistor 310 is connected to the gate of a third NMOSFET 320 and to a first end of a fourth resistor 310. The second end of fourth resistor 310 is connected to the gate of a fourth NMOSFET 320 and to a first end of a fifth resistor 310. The second end of fifth resistor 310 is connected to the gate of a fifth NMOSFET 320 and to a first end of a sixth resistor 310. The second end of sixth resistor 310 is connected to the gate of a sixth NMOSFET 320 and to the common potential node. In one non-limiting embodiment the resistors 310 are each 1 Mohm resistors.

Second terminal 120 is further connected to the drain of first NMOSFET 320, and the source of first NMOSFET 320 is connected to the drain of second NMOSFET 320. The source of second NMOSFET 320 is connected to the drain of third NMOSFET 320. The source of third NMOSFET 320 is connected to the drain of fourth NMOSFET 320. The source of fourth NMOSFET 320 is connected to the drain of fifth NMOSFET 320. The source of fifth NMOSFET 320 is connected to the drain of sixth NMOSFET 320 and the drain of sixth NMOSFET 320 is connect to the common potential node. In an exemplary embodiment the NMOSFETs 320 are each provided with a low sub-threshold current. In one non-limiting embodiment, the combination of sub-threshold current through the NMSOFETs 320 and resistors 310 is less than 250 µA.

In operation, when the potential of second terminal 120 is greater than that of the common potential node, i.e. when the associate solar panel is outputting electricity, resistors 310 act as a voltage divider to prevent voltage in excess of the rating of any of the NMOSFETs 320 from being exceeded, however substantially no current flows through resistors 310. The potential of the common potential node is pulled by the action of diode 255 of FIG. 2, and the optional additional active circuit, toward first terminal 110. Since sixth NMOSFET 320 is arranged with its gate connected to its source, only a negligible sub-threshold current flows through NMOSFETs 320.

When the potential of second terminal 120 is less than that of the common potential node, i.e. when the associate solar panel is not outputting electricity, diode 300 prevents the flow of current through resistors 310, and thus the potential of the gates of all NMOSFETs 320 are the same. Sixth NMOSFET 320 conducts, since due to the reverse polarity, current flow is from source to drain, and thus an appropriate turn on voltage between the gate and drain of sixth NMOSFET 320 is exhibited. Preferably, the turn on voltage of the NMOSFETs 320 are selected to be about 100 mV, thus providing a low voltage loss return path for low voltage oscillator 170.

The above has been described in an embodiment in which NMOSFETs exhibiting low threshold voltage with a high voltage rating are not implemented. In the event that an NMOSFET with a low threshold voltage and a high voltage rating is implemented, unidirectional valve circuit 210 may be provided by a single NMOSFET having its gate and source tied to the common potential node.

Figure 4:
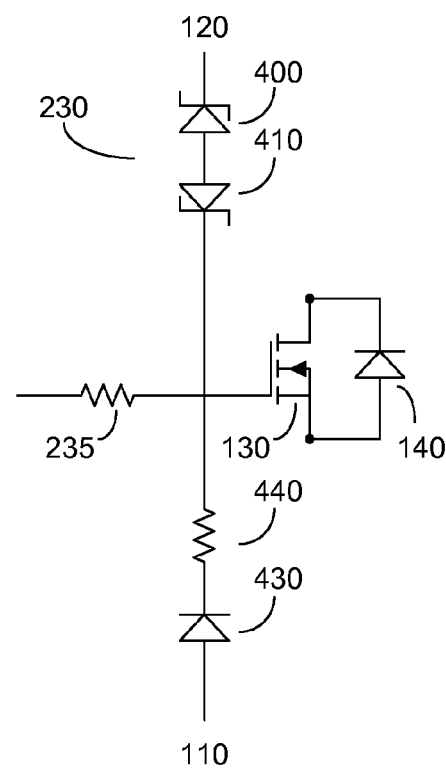
FIG. 4 illustrates a schematic diagram of an exemplary lightning protection circuit of the low voltage drop closed loop unidirectional electronic valve of FIG. 2.

FIG. 4 illustrates a schematic diagram of an exemplary lightning protection circuit 230 of the low voltage drop closed loop unidirectional electronic valve of FIG. 2 constituted of a first Zener diode 400; a second Zener diode 410; a diode 430 and a resistor 440. Electronically controlled switch 130, bypass element 140, resistor 235, first terminal 110 and second terminal 120 of FIG. 2 are further illustrated for clarity. The cathode of Zener diode 400 is connected to second terminal 120, and the anode of Zener diode 400 is connected to the anode of Zener diode 410. The cathode of Zener diode 410 is connected to the gate of electronically controlled switch and to a first end of resistor 440. The second end of resistor 440 is connected to the cathode of diode 430 and the anode of diode 430 is connected to first terminal 110. In one non-limiting embodiment, first Zener diode 400 exhibits a breakdown voltage of 25 volts, and second Zener diode 410 exhibits a breakdown voltage of 5 volts.

In operation, lightning striking first terminal 110 experiences a path through bypass element 140, and further charges up the gate of electronically controlled switch 130 via diode 430 and resistor 440. Lightning striking second terminal 120 passes through Zener diode 400 and Zener diode 410 to charge the gate of electronically controlled switch 130. The balance of the current will flow through electronically controlled switch 130 which is thus held fully on. Resistor 235, which in one non-limiting embodiment is a 100 Kohm resistor, isolates the lightning to gate current from the balance of the circuitry. Zener diode 410 blocks the output of charge pump 150 from proceeding through Zener diode 400 to second terminal 120.

Figure 5:
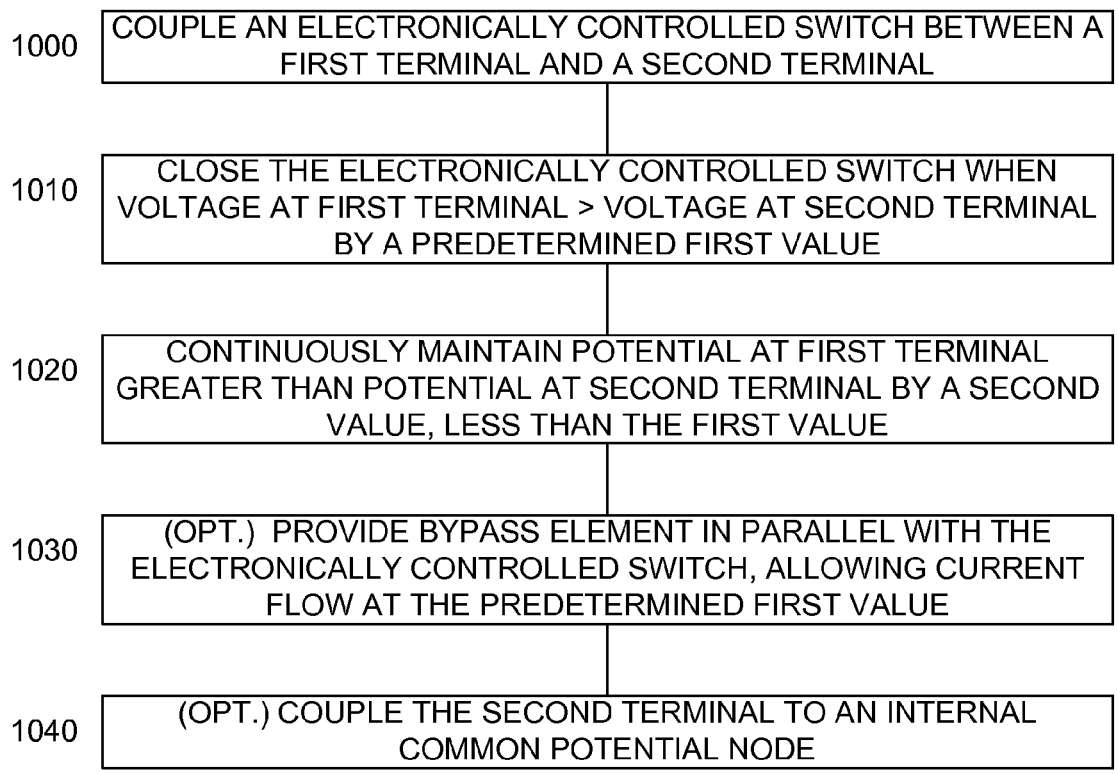
FIG. 5 illustrates a high level flow chart of a method of enabling a low voltage drop unidirectional current flow according to an exemplary embodiment.

FIG. 5 illustrates a high level flow chart of a method of enabling a low voltage drop unidirectional current flow according to an exemplary embodiment. In stage 1000, an electronically controlled switch coupled between a first terminal and a second terminal is provided. In stage 1010 the provided electronically controlled switch of stage 1000 is closed when the voltage potential at the first terminal is greater than the voltage potential at the second terminal by a first value, typically at least 0.4 volts.

In stage 1020, the voltage potential at the first terminal is continuously maintained at a potential greater than the voltage potential at the second terminal by a second value, the second value being less than the first value. In an exemplary embodiment the second value is 50 millivolts. Optionally the voltage potential is maintained by providing a first charge pump.

In optional stage 1030, a bypass element is provided in parallel with the provided electronically controlled switch of stage 1000, the bypass element arranged to allow the flow of current from the first terminal to the second terminal when the voltage potential at the first terminal is greater than the voltage potential at the second terminal by the first value. Initial power to the provided first charge pump is provided responsive to the voltage potential at the first terminal being greater than the voltage potential at said second terminal by the first value. In optional stage 1040 the second terminal is coupled to an internal common potential node when the voltage potential at the first terminal is greater than the voltage potential at the second terminal by at least the second value.

It is appreciated that certain features of the invention, which are, for clarity, described in the context of separate embodiments, may also be provided in combination in a single embodiment. Conversely, various features of the invention which are, for brevity, described in the context of a single embodiment, may also be provided separately or in any suitable sub-combination.

Unless otherwise defined, all technical and scientific terms used herein have the same meanings as are commonly understood by one of ordinary skill in the art to which this invention belongs. Although methods similar or equivalent to those described herein can be used in the practice or testing of the present invention, suitable methods are described herein.

All publications, patent applications, patents, and other references mentioned herein are incorporated by reference in their entirety. In case of conflict, the patent specification, including definitions, will prevail. In addition, the materials, methods, and examples are illustrative only and not intended to be limiting.

The terms "include", "comprise" and "have" and their conjugates as used herein mean "including but not necessarily limited to".

It will be appreciated by persons skilled in the art that the present invention is not limited to what has been particularly shown and described hereinabove. Rather the scope of the present invention is defined by the appended claims and includes both combinations and sub-combinations of the various features described hereinabove as well as variations and modifications thereof, which would occur to persons skilled in the art upon reading the foregoing description.

We claim:

1. A low voltage drop unidirectional electronic valve, comprising:
    a first terminal;
    a second terminal;
    a first electronically controlled switch coupled between said first terminal and said second terminal; and
    a first charge pump, said first electronically controlled switch responsive to an output of said first charge pump; and
    a start up unit coupled to said first terminal and arranged to provide initial power to said first charge pump responsive to a voltage potential at said first terminal being greater than a voltage potential at said second terminal by at least a first predetermined value;
    said first charge pump in a closed loop arrangement with said first electronically controlled switch so as to set, and maintain, said voltage potential at said first terminal greater than the voltage potential at said second terminal by a second predetermined value without requiring refresh, said second predetermined value less than said first predetermined value.

2. The low voltage unidirectional electronic valve of claim 1, further comprising:
    a bypass element coupled in parallel with said first electronically controlled switch, said bypass element arranged to allow the flow of current from said first terminal to said second terminal when the voltage potential at said first terminal is greater than the voltage potential at said second terminal by said first predetermined value.

3. The low voltage unidirectional electronic valve of claim 2, wherein said first electronically controlled switch is constituted of a metal oxide semiconductor field effect transistor exhibiting a body diode, said body diode being said bypass element.

4. A low voltage unidirectional electronic valve, comprising:
    a first terminal;
    a second terminal;
    a first electronically controlled switch coupled between said first terminal and said second terminal;
    a first charge pump, said first electronically controlled switch responsive to an output of said first charge pump;
    a start up unit coupled to said first terminal and arranged to provide initial power to said first charge pump responsive to a voltage potential at said first terminal being greater than a voltage potential at said second terminal by at least a first predetermined value; and
    a bypass element coupled in parallel with said first electronically controlled switch, said bypass element arranged to allow the flow of current from said first terminal to said second terminal when the voltage potential at said first terminal is greater than the voltage potential at said second terminal by said first predetermined value,
    said first charge pump in a closed loop arrangement with said first electronically controlled switch so as to set, and maintain, said voltage potential at said first terminal greater than the voltage potential at said second terminal by a second predetermined value, said second predetermined value less than said first predetermined value,
    wherein said start up unit comprises:
        an oscillator operative responsive to said voltage potential at said first terminal being greater than the voltage potential at said second terminal by said first predetermined value;
        a second charge pump responsive to said oscillator; and
        a second electronically controlled switch responsive to said second charge pump, said second electronically controlled switch arranged to couple said second terminal to an internal common node when said second charge pump is active.

5. The low voltage unidirectional electronic valve according to claim 4, wherein said start up unit further comprises:
a third charge pump operative responsive to said oscillator, said third charge pump arranged to provide said initial power to said first charge pump.

6. The low voltage unidirectional electronic valve of claim 5, wherein said start up unit further comprises:
a unidirectional valve circuit coupled between said oscillator and said second terminal, said unidirectional valve circuit arranged to provide an initial return path for said oscillator.

7. The low voltage unidirectional electronic valve of claim 6, further comprising a bootstrap circuit coupled between the output of said first charge pump and the power input of said first charge pump.

8. The low voltage unidirectional electronic valve of claim 7, further comprising a third electronically controlled switch connected between said second terminal and said internal common node, said third electronically controlled switch responsive to said bootstrap circuit.

9. A method of enabling a low voltage drop unidirectional current flow, the method comprising:
providing an electronically controlled switch coupled between a first terminal and a second terminal;
closing said provided electronically controlled switch when a voltage potential at said first terminal is greater than a voltage potential at said second terminal by a first predetermined value, thereby setting said voltage potential at said first terminal greater than the voltage potential at said second terminal by a second predetermined value, said second predetermined value less than said first predetermined value; and
continuously maintaining said voltage potential at said first terminal greater than the voltage potential at said second terminal by said second predetermined value in a closed loop, while continuously maintaining said provided electronically controlled switch in the closed state without requiring refresh.

10. The method of claim 9, further comprising:
providing a first charge pump, said continuously maintaining said provided electronically controlled switch in the closed state being responsive to said provided first charge pump.

11. The method of claim 10, further comprising:
providing a bypass element coupled in parallel with said provided electronically controlled switch, said bypass element arranged to allow the flow of current from the first terminal to the second terminal when the voltage potential at the first terminal is greater than the voltage potential at the second terminal by said first predetermined value; and
providing initial power to said provided first charge pump responsive to said voltage potential at said first terminal being greater than the voltage potential at said second terminal by said first predetermined value.

12. The method of claim 11, further comprising:
coupling said second terminal to an internal common node.

13. A low voltage drop unidirectional electronic valve, comprising:
a first terminal;
a second terminal;
a first electronically controlled means for alternately connecting and disconnecting, said first electronically controlled means for alternately connecting and disconnecting arranged to alternately connect said first terminal to said second terminal and disconnect said first terminal from said second terminal; and
a first means for increasing a voltage potential, said first means for increasing a voltage potential arranged to connect said first terminal to said second terminal via said first electronically controlled means for alternately connecting and disconnecting when a voltage potential at said first terminal is greater than a voltage potential at said second terminal by a first predetermined value, said connection of said first terminal to said second terminal thereby setting said voltage at said first terminal greater than the voltage potential at said second terminal by a second predetermined value, said second predetermined value less than said first predetermined value,
said first means for increasing a voltage potential arranged in a closed loop with said electronically controlled means for alternately connecting and disconnecting so as to maintain said voltage potential at said first terminal greater than the voltage potential at said second terminal by said second predetermined value while maintaining said first electronically controlled means for alternately connecting and disconnecting in a closed state without requiring refresh.

14. The low voltage unidirectional electronic valve of claim 13, further comprising:
a means for bypassing coupled in parallel with said first electronically controlled means for alternately connecting and disconnecting, said means for bypassing arranged to allow the flow of current from said first terminal to said second terminal when the voltage potential at said first terminal is greater than the voltage potential at said second terminal by said first predetermined value; and
a means for start up coupled to said first terminal and arranged to provide initial power to said first means for increasing a voltage potential responsive to said voltage potential at said first terminal being greater than the voltage potential at said second terminal by said first predetermined value.

15. The low voltage unidirectional electronic valve according to claim 14, wherein said means for start up comprises:
a means for oscillating operative responsive to said voltage potential at said first terminal being greater than the voltage potential at said second terminal by said first predetermined value;
a third means for increasing a voltage potential, said third means for increasing a voltage potential operative responsive to said means for oscillating,
said third means for increasing a voltage potential arranged to provide said initial power to said first means for increasing a voltage potential.

16. A low voltage unidirectional electronic valve comprising:
a first terminal;
a second terminal;
a first electronically controlled means for alternately connecting and disconnecting, said first electronically controlled means for alternately connecting and disconnecting arranged to alternately connect said first terminal to said second terminal and disconnect said first terminal from said second terminal;
a first means for increasing a voltage potential, said first means for increasing a voltage potential arranged to connect said first terminal to said second terminal via said first electronically controlled means for alternately connecting and disconnecting when a voltage potential at said first terminal is greater than a voltage potential at said second terminal by a first predetermined value, said connection of said first terminal to said second terminal thereby setting said voltage at said first terminal greater than the voltage potential at said second terminal by a second predetermined value, said second predetermined value less than said first predetermined value, said first means for increasing a voltage potential arranged in a closed loop with said electronically controlled means for alternately connecting and disconnecting so as to continuously maintain said voltage potential at said first terminal greater than the voltage potential at said second terminal by said second predetermined value;

a means for bypassing coupled in parallel with said first electronically controlled means for alternately connecting and disconnecting, said means for bypassing arranged to allow the flow of current from said first terminal to said second terminal when the voltage potential at said first terminal is greater than the voltage potential at said second terminal by said first predetermined value; and a means for start up coupled to said first terminal and arranged to provide initial power to said first means for increasing a voltage potential responsive to said voltage potential at said first terminal being greater than the voltage potential at said second terminal by said first predetermined value, wherein said means for start up comprises:

a means for oscillating operative responsive to said voltage potential at said first terminal being greater than the voltage potential at said second terminal by said first predetermined value;

a second means for increasing a voltage potential, said second means for increasing a voltage potential responsive to said means for oscillating; and a second electronically controlled means for alternately connecting and disconnecting, said second electronically controlled means for alternately connecting and disconnecting responsive to said second means for increasing a voltage potential and arranged to couple said second terminal to an internal common node when said second means for increasing a voltage potential is active.

17. The low voltage unidirectional electronic valve according to claim 16, wherein said means for start up further comprises:

a third means for increasing a voltage potential, said third means for increasing a voltage potential operative responsive to said means for oscillating, said third means for increasing a voltage potential arranged to provide said initial power to said first means for increasing a voltage potential.

* * * * *